(12) United States Patent
Asano

(10) Patent No.: US 12,474,221 B2
(45) Date of Patent: Nov. 18, 2025

(54) SEMICONDUCTOR MODULE AND METHOD OF MANUFACTURING SEMICONDUCTOR MODULE

(71) Applicant: FUJI ELECTRIC CO., LTD., Kawasaki (JP)

(72) Inventor: Taizo Asano, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 642 days.

(21) Appl. No.: 17/726,292

(22) Filed: Apr. 21, 2022

(65) Prior Publication Data

US 2022/0412811 A1   Dec. 29, 2022

(30) Foreign Application Priority Data

Jun. 29, 2021   (JP) .................. 2021-107947

(51) Int. Cl.
  *G01K 7/01*   (2006.01)
  *G05F 1/46*   (2006.01)
  *H01L 21/66*  (2006.01)

(52) U.S. Cl.
  CPC ............... *G01K 7/01* (2013.01); *H01L 22/14* (2013.01); *H01L 22/32* (2013.01); *G01K 7/015* (2013.01); *G05F 1/46* (2013.01); *G05F 1/462* (2013.01)

(58) Field of Classification Search
  CPC ........ G01K 15/005; G01K 7/01; G01K 7/015; G05F 1/569; G05F 1/462; G05F 1/463;

(Continued)

(56) References Cited

U.S. PATENT DOCUMENTS

2003/0090274 A1*  5/2003  Kitade ................. G11C 29/785
                                                    324/550
2006/0006166 A1*  1/2006  Chen ...................... G05D 23/20
                                                    219/209

(Continued)

FOREIGN PATENT DOCUMENTS

JP       H05-40533 A     2/1993
JP       2006-105870 A   4/2006

(Continued)

OTHER PUBLICATIONS

English translation of JP-2006108256-A (Year: 2006).*

*Primary Examiner* — Dale E Page
*Assistant Examiner* — Douglas Yap
(74) *Attorney, Agent, or Firm* — Rabin & Berdo, P.C.

(57) ABSTRACT

A semiconductor module with temperature characteristics adjustable through a measurement device. The semiconductor module includes a mounting board having a semiconductor chip and an integrated circuit mounted thereon. The semiconductor chip includes a switching device and a diode for temperature detection, a forward voltage of the diode being measurable by the measurement device. The integrated circuit includes a correction circuit that generates a corrected reference voltage, and a control circuit that receives the corrected reference voltage and a drive signal, and controls the switching device based on the corrected reference voltage and the drive signal. The mounting board includes a pad to be coupled to the diode with a wire. The pad has an area larger than a sum of a first area to be coupled to the wire and a second area to be in contact with the probe of the measurement device for measuring the forward voltage.

4 Claims, 10 Drawing Sheets

(58) Field of Classification Search
CPC . G05F 1/46; G05F 1/461; G05F 1/565; G05F 1/56; G05F 1/567; G05F 1/005; H10D 8/00; H10D 8/045; H10D 8/411; H10D 8/422; G10N 27/129; H01L 2224/04042; H01L 2224/48135–48149; H01L 2224/48151–48265; H01L 22/30; H01L 22/32; H05K 1/111–114; H05K 1/117; H05K 2201/09372–0949; H05K 2201/097; H05K 2201/09709; H05K 2201/09727; H05K 2203/173

See application file for complete search history.

(56) References Cited

U.S. PATENT DOCUMENTS

| | | | |
|---|---|---|---|
| 2007/0014329 A1* | 1/2007 | Sinha | G01K 7/16 |
| | | | 374/185 |
| 2014/0061643 A1* | 3/2014 | Kaeriyama | H01L 23/528 |
| | | | 257/48 |
| 2016/0258821 A1 | 9/2016 | Tsurumaru | |
| 2016/0372454 A1* | 12/2016 | Minagawa | H10D 89/611 |
| 2018/0005908 A1* | 1/2018 | Nakasaki | H01L 24/09 |
| 2019/0356128 A1* | 11/2019 | Shimizu | H03K 17/08116 |
| 2020/0303267 A1* | 9/2020 | Higuchi | H01L 24/48 |
| 2021/0366788 A1* | 11/2021 | Nakata | H01L 22/14 |

FOREIGN PATENT DOCUMENTS

| | | | |
|---|---|---|---|
| JP | 2006108256 A * | 4/2006 | |
| JP | 2016166860 A | 9/2016 | |

\* cited by examiner

SEMICONDUCTOR MODULE AND METHOD OF MANUFACTURING SEMICONDUCTOR MODULE

CROSS-REFERENCE TO RELATED APPLICATION

The present application claims priority pursuant to 35 U.S.C. § 119 from Japanese patent application number 2021-107947, filed on Jun. 29, 2021, the entire disclosure of which is hereby incorporated by reference herein.

BACKGROUND

Technical Field

The present disclosure relates to a semiconductor module and a method of manufacturing a semiconductor module.

Description of the Related Art

There have been known semiconductor modules having a semiconductor chip on which a switching device such as an IGBT and a diode for temperature detection are formed and an integrated circuit (IC) that drives the switching device based on the temperature detection results. In such a semiconductor module, variation in temperature characteristics of the diode or other factors can decrease the accuracy in temperature detection. To address this, there have been proposed techniques in which temperature characteristics of the diode are measured for correction (for example, Japanese Patent Application Publication Nos. 2006-105870, 2016-166860, and H5-40533).

In Japanese Patent Application Publication No. 2006-105870, temperature characteristics of the diode are measured and correction is made, in a state before the semiconductor chip is mounted (in a state of a wafer). In this case, there is a possibility that the temperature characteristics can change due to the effects of stress or other factors after the semiconductor chip is mounted. Japanese Patent Application Publication Nos. 2016-166860 and H5-40533 use a non-volatile memory such as an EEPROM to make correction and hence are costly.

SUMMARY

An aspect of the present disclosure is a semiconductor module with temperature characteristics adjustable through a measurement device, the semiconductor module comprising: a semiconductor chip including a switching device and a diode for temperature detection, a forward voltage of the diode being measurable by a probe of the measurement device; an integrated circuit including a correction circuit and a control circuit, the correction circuit being configured to generate a corrected reference voltage, the control circuit being configured to receive the corrected reference voltage and a drive signal, and to control switching of the switching device based on the corrected reference voltage and the drive signal; and a mounting board having the semiconductor chip and the integrated circuit mounted thereon, wherein the mounting board includes a pad configured to be coupled to the diode with a wire, and the pad has an area larger than a sum of a first area to be coupled to the wire and a second area to be in contact with the probe of the measurement device for measuring the forward voltage.

Another aspect of the present disclosure is a method of manufacturing a semiconductor module including a semiconductor chip including a switching device and a diode for temperature detection, and an integrated circuit including a fuse circuit and a control circuit, the fuse circuit being configured to generate a corrected reference voltage, the control circuit being configured to control switching of the switching device based on the corrected reference voltage and a drive signal, the method comprising: providing a mounting board having a pad; a first mounting step of mounting the semiconductor chip on the mounting board; a bonding step of coupling the pad of the mounting board and the diode of the semiconductor chip to each other with a wire; a measurement step of supplying a predetermined current to the diode at a predetermined temperature and obtaining measurement data indicating a forward voltage of the diode using a probe of a measurement device; a trimming step of performing laser trimming on the fuse circuit of the integrated circuit based on the measurement data; and a second mounting step of mounting the integrated circuit, after the fuse circuit thereof is subjected to the laser trimming, on the mounting board.

DETAILED DESCRIPTION

At least following matters will become apparent from the descriptions of the present specification and the accompanying drawings.

EMBODIMENT

<<<Overview of Semiconductor Module 10>>>

Figure 1:
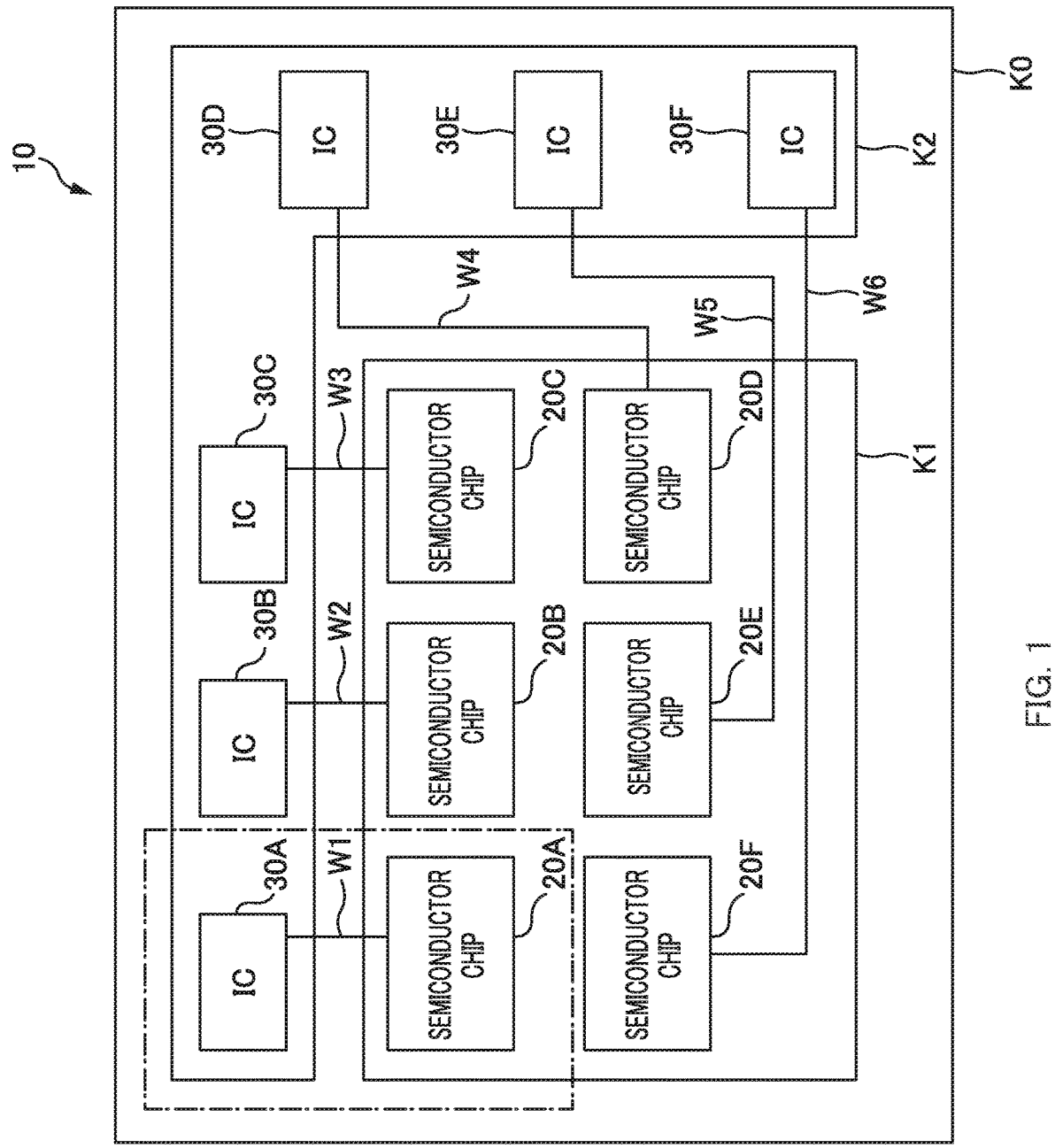
FIG. 1 is an overall schematic diagram of a semiconductor module 10 according to an embodiment of the present disclosure.
Figure 2:
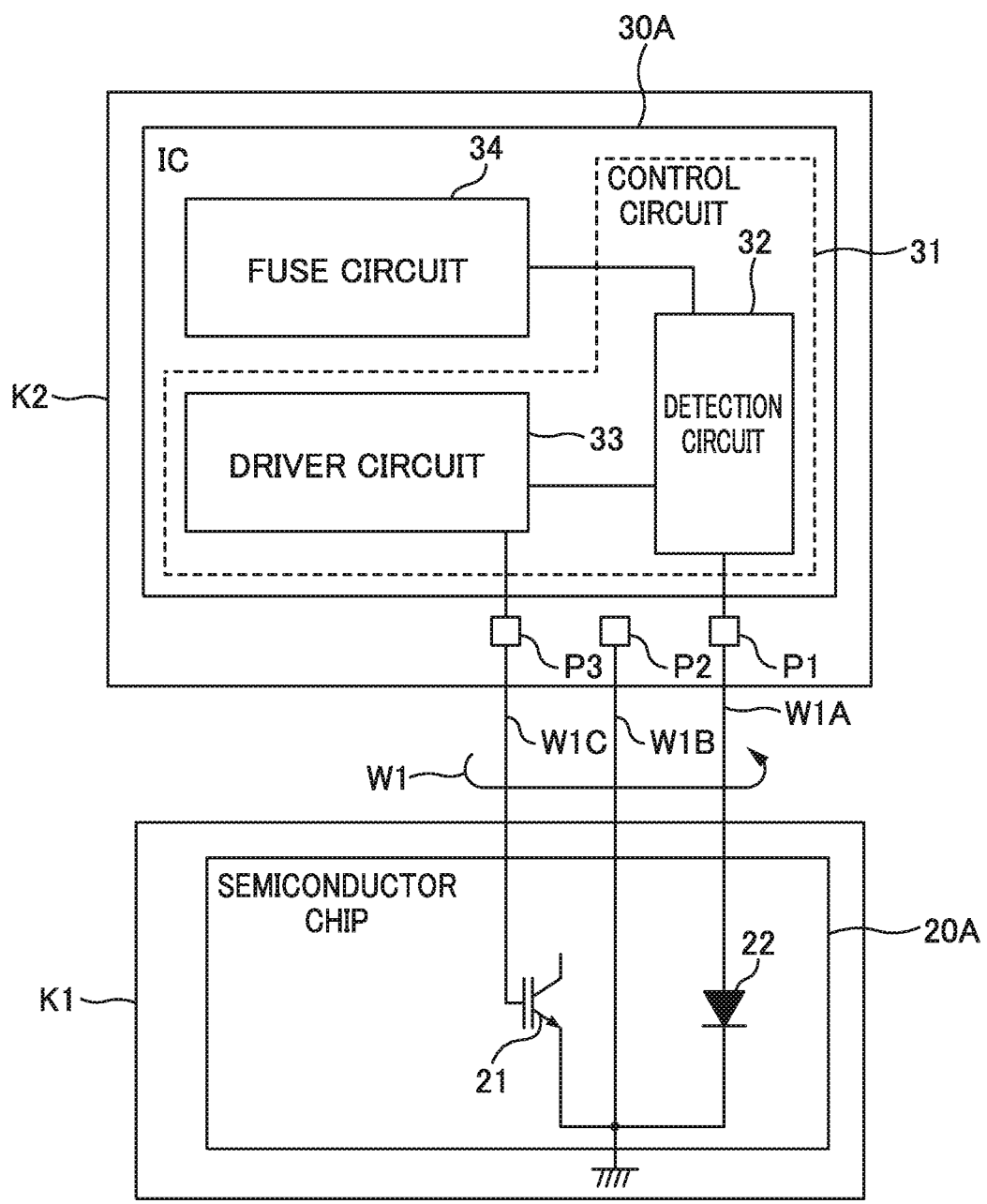
FIG. 2 is a detailed diagram of a part surrounded by dashed-dotted lines in FIG. 1.

FIG. 1 is an overall schematic diagram of a semiconductor module 10 according to an embodiment of the present disclosure. FIG. 2 is a detailed diagram of a part surrounded by dashed-dotted lines in FIG. 1.

The semiconductor module 10 according to the embodiment of the present disclosure is, for example, a power module to drive a load (not illustrated) such as a three-phase motor and includes a base substrate K0, substrates K1 and K2, semiconductor chips 20A to 20F, integrated circuits (hereinafter called ICs) 30A to 30F, and sets of wiring W1 to W6. Note that the base substrate K0 and the substrates K1 and K2 correspond to a "mounting board".

The base substrate K0 is, for example, a metal plate having a rectangular shape in plan view, made of aluminum, copper or an alloy containing these and has a smooth joint surface on its upper surface on which the substrate K1 and the substrate K2 are joined. The substrate K1 and the substrate K2 are attached to the base substrate K0 via a not-illustrated joining material (such as solder).

The substrate K1 is a substrate on which the semiconductor chips 20A to 20F are mounted and which corresponds to a "first substrate". The substrate K1 is a multilayer substrate including an insulation layer made of a ceramic or a resin and a conductive layer formed on the insulation layer. The substrate K1 according to the embodiment of the present disclosure is a direct copper bonding (DCB) substrate in which a copper conductive pattern is formed on the ceramic layer.

The substrate K2 is a substrate on which the ICs 30A to 30F are mounted and which corresponds to a "second substrate". The substrate K2 according to the embodiment of the present disclosure is a printed circuit board (PCB) that is made of glass epoxy and has a conductive wiring pattern and on which electronic parts are soldered. In addition, as illustrated in FIG. 2, the substrate K2 has pads P1, P2, and P3 in the vicinities of the position of each IC (the IC 30A in FIG. 2).

As illustrated in FIG. 1, the substrates K1 and K2 are provided on the base substrate K0 so as to be apart from each other. However, the disclosure is not limited to this configuration, but, for example, a configuration is possible in which one substrate has a part on which the semiconductor chips 20A to 20F are mounted (a part as the substrate K1) and a part on which the ICs 30A to 30F are mounted (a part as the substrate K2), and these parts are electrically insulated. In this case, the one substrate corresponds to a "mounting board".

Each of the semiconductor chips 20A to 20F has a switching device 21 and a diode 22 within the chip.

The switching device 21 supplies electric power to the load. The switching device 21 according to the embodiment of the present disclosure is an insulated gate bipolar transistor (IGBT). In the embodiment of the present disclosure, the semiconductor chips 20A to 20C are used as lower arm devices provided on the ground side of a bridge circuit (not illustrated), and the semiconductor chips 20D to 20F are used as upper arm devices provided on the power supply side. Although an IGBT is used for the switching device 21 in the embodiment of the present disclosure, for example, the switching device 21 may be a bipolar transistor or a MOS transistor.

The diode 22 is a temperature detection diode for detecting the chip temperature (more specifically, the temperature of the switching device 21). The diode 22 has a negative temperature characteristic. As the temperature increases, a forward voltage VF decreases, and as the temperature decreases, the forward voltage VF increases. With measurement of the relationship between the forward voltage VF of the diode 22 and temperature (temperature characteristic) in advance, it is possible to detect the temperature of the operating switching device 21 from the forward voltage VF of the diode 22. The semiconductor module 10 according to the embodiment of the present disclosure has an overheat protection function. As will be described later, the semiconductor module 10 performs overheat protection operation for stopping operation of the switching device 21 based on the temperature detected. This makes it possible to prevent damage to the switching device 21 and the like. Note that other than overheat protection, for example, a configuration is possible in which the driving capability of the switching device 21 is changed according to temperature. Although in the embodiment of the present disclosure, one semiconductor chip has only one diode 22 for simplicity, the disclosure is not limited to this configuration. For example, a plurality of diodes 22 may be coupled in series.

The ICs 30A to 30F, which are integrated circuits respectively associated with the semiconductor chips 20A to 20F, are provided on the substrate K2. Although FIG. 2 illustrates the configuration of the IC 30A, the other ICs (the ICs 30B to 30F) have the same or similar configurations. As illustrated in FIG. 2, the IC 30A has a control circuit 31 and a fuse circuit 34. The control circuit 31 has a detection circuit 32 and a driver circuit 33. Details of these circuits will be described later.

The set of wiring W1 electrically couples the semiconductor chip 20A and the IC 30A. Similarly, the sets of wiring W2 to W6 electrically couple the semiconductor chips 20B to 20F and the ICs 30B to 30F, respectively. Note that the term "electrically coupling" means coupling things by using wiring or joining materials (such as solder) so that they are electrically continuous. The term "electrically coupling" is hereinafter also simply referred to as coupling.

As illustrated in FIG. 2, the set of wiring W1 includes wires W1A, W1B, and W1C. These wires are, for example, bonding wires made of copper, aluminum, gold, or an alloy containing these.

The wire W1A is coupled between a pad P1 provided on the substrate K2 and an anode of the diode 22 on the substrate K1. A cathode of the diode 22 is grounded.

The wire W1B is coupled between the pad P2 provided on the substrate K2 and the ground line of the substrate K1.

The wire W1C is coupled between the pad P3 provided on the substrate K2 and a gate of the switching device 21 on the substrate K1. The switching device 21 has an emitter grounded and a collector coupled to an external device (a load) via a terminal (not illustrated).

<<<Configuration of IC 30A>>>

Figure 3:
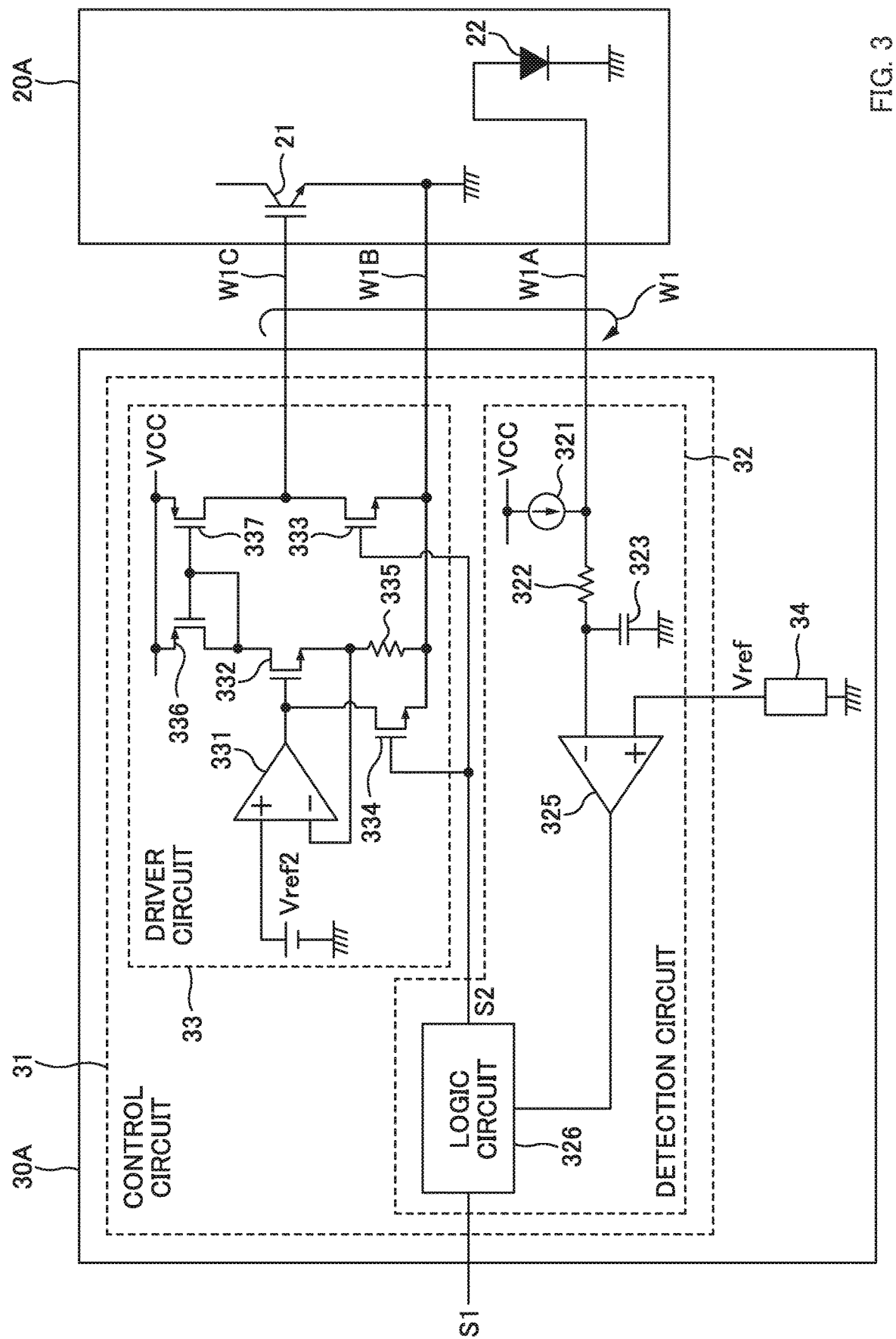
FIG. 3 is a circuit diagram illustrating an example of a configuration of an IC 30A.

FIG. 3 is a circuit diagram illustrating an example of the configuration of the IC 30A. Note that in FIG. 3, illustration of the substrates (substrates K1 and K2) and the pads (pads P1, P2, and P3) is omitted for convenience. As described earlier, the IC 30A includes the control circuit 31 and the fuse circuit 34.

<<Control Circuit 31>>

The control circuit 31 controls switching of the switching device 21 based on a reference voltage Vref corrected by the fuse circuit 34 described later and a drive signal S1 outputted from a microcomputer (not illustrated) and includes the detection circuit 32 and the driver circuit 33.

<Detection Circuit 32>

The detection circuit 32 detects the forward voltage VF of the diode 22 to detect the temperature of the diode 22.

The detection circuit 32 illustrated in FIG. 3 includes a constant current source 321, a resistor 322, a capacitor 323, a comparator 325, and a logic circuit 326.

The constant current source 321 generates a predetermined constant current (predetermined current) from the power supply voltage VCC and supplies the generated constant current to the anode of the diode 22 via the wire W1A.

The resistor 322 and the capacitor 323 configure a filter for removing noise. The resistor 322 has one end coupled to the anode of the diode 22 and the other end coupled to the inverting input terminal (−terminal) of the comparator 325.

The capacitor 323 has one end coupled to a point between the −terminal of the comparator 325 and the resistor 322, and the other end of the capacitor 323 is grounded.

The inverting input terminal (−terminal) of the comparator 325 is coupled to the anode of the diode 22 via the aforementioned resistor 322. The non-inverting input terminal (+terminal) of the comparator 325 is coupled to the fuse circuit 34 (described later) and receives the corrected reference voltage Vref (described later). The comparator 325 compares the voltage of the +terminal and the voltage of the −terminal and outputs a signal according to the comparison result of those signals. Specifically, the comparator 325 outputs a high level (hereinafter, an H level) signal when the voltage of the +terminal is larger than the voltage of the −terminal, and outputs a low level (hereinafter, an L level) signal when the voltage of the −terminal is larger than the voltage of the +terminal.

The logic circuit 326 controls the operation of the switching device 21 driven by the driver circuit 33, according to the output (in other words, the temperature detection results) of the comparator 325. The operation of the logic circuit 326 will be described later.

<Driver Circuit 33>

The driver circuit 33 performs switching (on and off) of the switching device 21 based on the drive signal S1.

As illustrated in FIG. 3, the driver circuit 33 includes an operational amplifier 331, NMOS transistors 332 to 334, a resistor 335, and PMOS transistors 336 and 337.

The non-inverting input terminal (+terminal) of the operational amplifier 331 receives a reference voltage Vref2. The inverting input terminal (−terminal) of the operational amplifier 331 is coupled to one end of the resistor 335 and the source of the NMOS transistor 332. The operational amplifier 331 controls the NMOS transistor 332 such that the voltage of the −terminal is equal to the reference voltage Vref2 applied to the +terminal. More specifically, the −terminal of the operational amplifier 331 receives the voltage generated at the resistor 335 according to the value of the current flowing through the NMOS transistor 332, and the operational amplifier 331 controls the value of the current flowing through the NMOS transistor 332 such that the voltage difference between the +terminal and the −terminal is zero. As a result, a current determined by the +terminal voltage and the resistance value of the resistor 335 flows through the NMOS transistor 332, and thus, as the +terminal voltage increases, the current flowing through the NMOS transistor 332 increases in proportion to the magnitude of the +terminal voltage (voltage-current conversion).

A drain of the NMOS transistor 332 is coupled to a drain of the PMOS transistor 336, and a gate of the NMOS transistor 332 is coupled to a drain of the NMOS transistor 334.

A drain of the NMOS transistor 333 is coupled to a drain of the PMOS transistor 337. Gates of the NMOS transistors 333 and 334 receive a signal S2 outputted from the logic circuit 326. The signal S2 is basically the same as the drive signal S1, but when overheat is detected by the detection circuit 32, the signal S2 is fixed to the H level (details will be described later). In addition, the sources of the NMOS transistors 333 and 334 and the other end of the resistor 335 are grounded.

The PMOS transistor 336 and the PMOS transistor 337 configure a current mirror circuit. The drain of the PMOS transistor 337 is coupled to the gate of the switching device 21 via the wire W1C.

As mentioned above, since the PMOS transistor 336 and the PMOS transistor 337 configure a current mirror circuit, a current flowing through the PMOS transistor 337 has a magnitude according to the current flowing through the PMOS transistor 336 and the NMOS transistor 332.

<<Fuse Circuit 34>>

Figure 4:
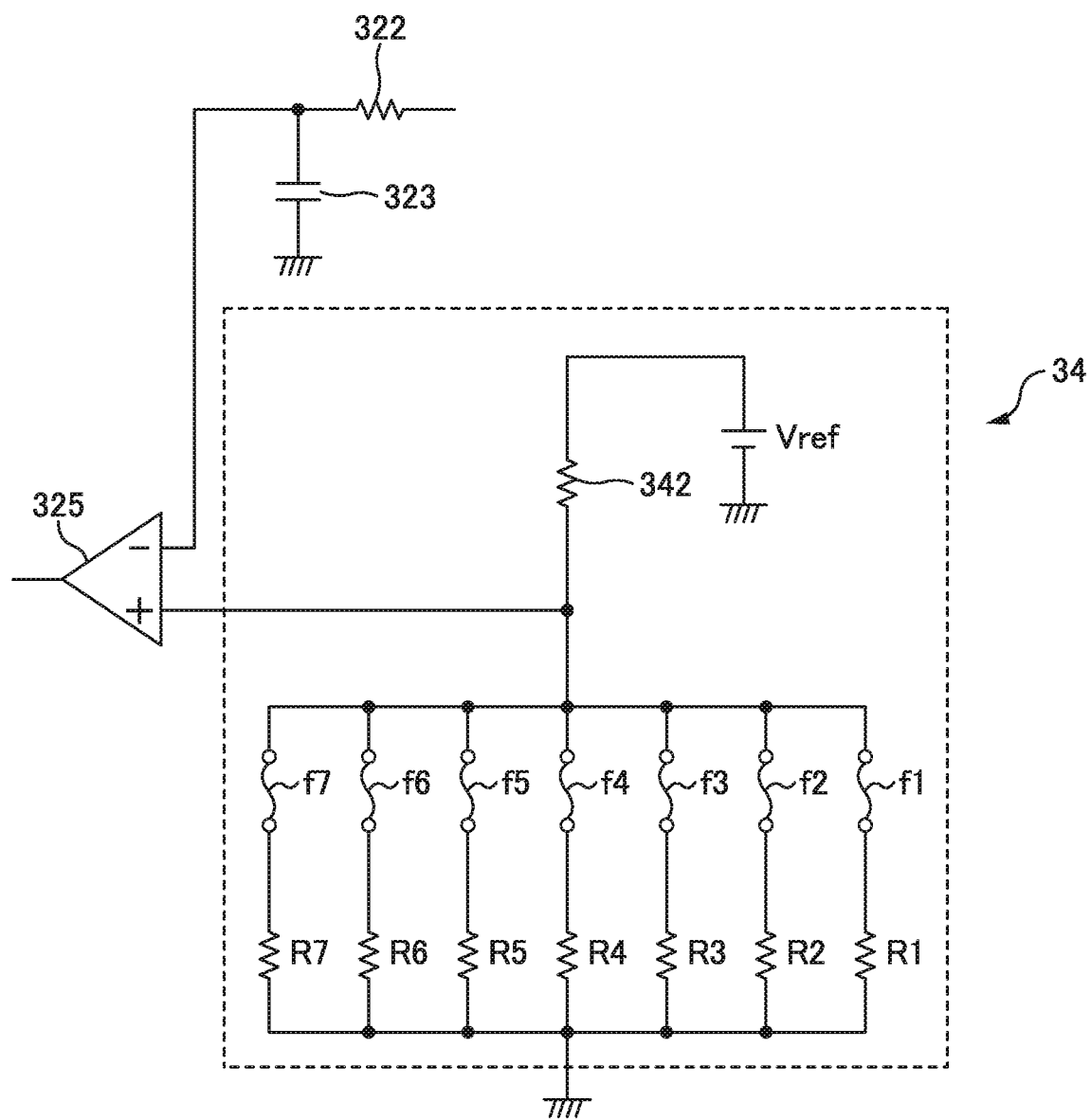
FIG. 4 is a circuit diagram illustrating an example of a configuration of a fuse circuit 34.

FIG. 4 is a circuit diagram illustrating an example of the configuration of the fuse circuit 34. Note that the fuse circuit 34 is a circuit for correcting the reference voltage Vref applied to the +terminal of the comparator 325 and corresponds to a "correction circuit".

The fuse circuit 34 illustrated in FIG. 4 includes a variable resistor including fuses f1 to f7, resistors R1 to R7, and a resistor 342.

The reference voltage Vref is applied to one end of the resistor 342, and the other end of the resistor 342 is coupled to the +terminal of the comparator 325 and all ends on one side of the fuses f1 to f7. Note that the reference voltage Vref is used for detecting the forward voltage VF at a time when the diode 22 is supplied with a predetermined current (in this case, the constant current generated by the constant current source 321) at a predetermined temperature. Ends on one side of the resistors R1 to R7 are coupled to the respective ends on the other side of the fuses f1 to f7, and the ends on the other side of the resistors R1 to R7 are grounded.

The fuses f1 to f7 are, for example, polysilicon fuses made of polysilicon and can be selectively cut by laser trimming.

With the configuration described above, it is possible to correct the reference voltage Vref applied to the +terminal of the comparator 325 by selectively cutting the fuses f1 to f7. For example, in the case of leaving only the fuse f4 and cutting the other fuses, the voltage obtained by dividing the reference voltage Vref with the resistor 342 and the resistor R4 is applied to the +terminal of the comparator 325.

Note that the fuse circuit 34 is not limited to the one in the embodiment of the present disclosure but can be any circuit that can serve as a variable resistor. For example, a configuration is possible in which a plurality of resistors are coupled in series, and each resistor is provided with a fuse in parallel. Then the plurality of fuses may be selectively cut by laser trimming.

As an alternative configuration, each fuse may be a switch, and the on/off of the switches may be controlled by using a nonvolatile memory (EEPROM or the like). However, in this case, the use of the nonvolatile memory leads to an extra cost. In contrast, the embodiment of the present disclosure does not need a nonvolatile memory, leading to a cost reduction.

<<<Operation of Control Circuit 31>>>

First, the driver circuit 33 will be described.

In the case in which the signal S2 applied to the gates of the NMOS transistors 333 and 334 is an H level, the NMOS transistors 333 and 334 are on. This makes the NMOS transistor 332 off, and also makes the PMOS transistors 336 and 337 configuring the current mirror circuit off. Since the NMOS transistor 333 is on, electric charge is discharged from the gate of the switching device 21, making the switching device 21 off.

In the case in which the signal S2 applied to the gates of the NMOS transistors 333 and 334 is an L level, the NMOS transistors 333 and 334 are off. This makes the NMOS transistor 332 on, and also makes the PMOS transistors 336 and 337 composing the current mirror circuit on. Since the NMOS transistor 333 is off, and the PMOS transistor 337 is on, electric charge is supplied to the gate of the switching device 21, making the switching device 21 on.

Next, operation of the detection circuit 32 will be described.

In the detection circuit 32, the comparator 325 compares the reference voltage Vref corrected by the fuse circuit 34 and the forward voltage VF of the diode 22 supplied with the constant current by the constant current source 321. In the case in which the output of the comparator 325 is an L level, the logic circuit 326 outputs the signal S2 having the same logic level as the drive signal S1 to the driver circuit 33. With this, the driver circuit 33 drives the switching device 21 according to the signal S2. In the case in which the output of the comparator 325 is an H level, the logic circuit 326 performs control such that the driver circuit 33 does not drive the switching device 21. Specifically, the signal S2 from the logic circuit 326 is fixed to the H level. This forcibly turns off the switching device 21, preventing damage or the like to the switching device 21 due to overheating (overheat protection).

In the embodiment of the present disclosure, the logic circuit 326 in the IC performs overheat protection, but the disclosure is not limited to this configuration. For example, as a possible configuration, the detection results of the detection circuit 32 may be outputted to a microcomputer (not illustrated), and the microcomputer may control the drive signal S1. As an alternative configuration, overheat protection is performed within the IC as in the embodiment of the present disclosure, and a signal indicating that overheat protection was performed may be outputted to a microcomputer.

In the embodiment of the present disclosure, as described above, the temperature characteristics of the forward voltage VF of the diode 22 are measured in advance, and laser trimming is performed on the fuse circuit 34 based on the results (measurement data) to correct the variation in the forward voltage VF of the diode 22.

Here, if the above characteristics are measured before the semiconductor chip is mounted on the substrate K1, there is a possibility that the characteristics of the diode 22 may change after being mounted. In addition, there is a possibility that the variation in the length or thickness of (specifically, the wiring resistance) of the wire W1A or other factors may decrease the accuracy in correction.

In the case in which the characteristics are measured with the semiconductor chips 20A to 20F mounted on the substrate K1, it means that after the diode 22 is coupled to the pad P1 of the substrate K2 with the wire W1A, a probe of the measurement device is brought in contact with the pad P1 to conduct measurement. However, in this case, there is a possibility that the wire W1A coupled to the pad P1 can interfere with the probe, making it difficult to conduct measurement (which means that it is impossible to conduct accurate measurement). In addition, if the probe coming in contact with the pad P1 causes damages to the pad P1 in the measurement, there is a possibility of causing a coupling error when the IC is mounted.

Hence, in the embodiment of the present disclosure, the accuracy in the correction is improved by devising the configuration of the pad P1 and the manufacturing method of the semiconductor module 10. This in turn improves the accuracy in the temperature detection.

<<<Regarding Pad P1>>>

Figure 5A:
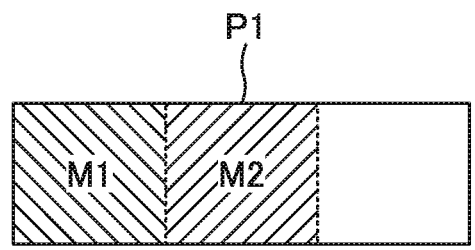
FIGS. 5A to 5C are explanatory diagrams of a pad P1 according to the embodiment of the present disclosure.
Figure 5B:
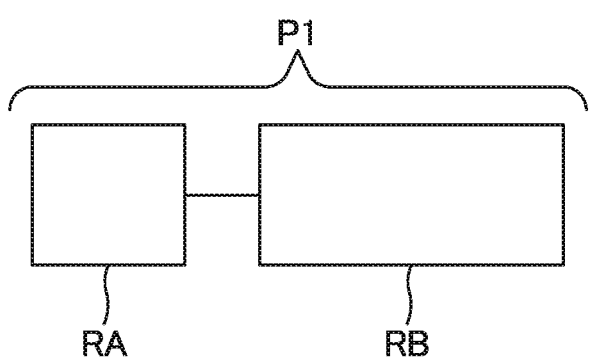
Figure 5C:
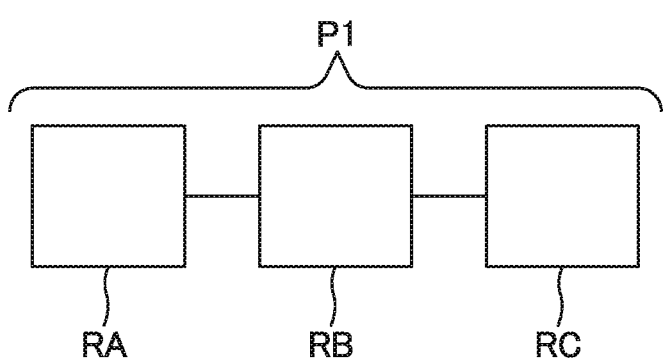

FIGS. 5A to 5C are explanatory diagrams of the pad P1 according to the embodiment of the present disclosure, shown in FIG. 2. FIG. 5A illustrates a first form, FIG. 5B a second form, and FIG. 5C a third form.

The pad P1 of FIG. 5A (first form) is formed to be a rectangular shape in plan view.

Of the pad P1 in the figure, a hatched area M1 is an area to be coupled to the wire W1A and corresponds to a "first area". The area M1 is determined in consideration of the accuracy (the variation) in the coupling position of the wire W1A, the thickness of the wire W1A, and other factors.

The area M2 is an area to be in contact with the probe of the measurement device (for example, a probe 101 of a measurement device 100 described later) and corresponds to a "second area". Note that the area M2 is determined in consideration of the size (thickness) of the distal end of the probe, the strength of the contact, the positional deviation, and other factors. Although in FIG. 5A, the area M2 has approximately the same size (area) as the area M1, the disclosure is not limited to this configuration, but the area M2 may have a different size from that of the area M1.

As illustrated in FIG. 5A, the pad P1 according to the embodiment of the present disclosure has a size (area) larger than the sum of the area M1 and the area M2. This configuration makes it possible to bring the probe of the measurement device reliably in contact with the pad P1 after the wire W1A is coupled to the pad P1. Hence, it can improve the accuracy in the measurement.

The pad P1 of FIG. 5B (the second form) is physically partitioned into a region RA and a region RB. Note that the region RA and the region RB are electrically coupled to each other.

The region RA is a region to which the wire W1A is coupled and has a size corresponding to the area M1 in FIG. 5A. The region RA corresponds to a "first region".

The region RB is a region with which the probe of the measurement device is brought in contact and has a size equal to the size of the pad P1 of FIG. 5A excluding the area M1. The region RB corresponds to a "second region". In this form, too, the pad P1 has a size larger than the sum of the area M1 and the area M2.

Although in FIG. 5B, the region RB has a larger size than the region RA, the disclosure is not limited to this configuration. The pad P1 only needs to satisfy the conditions that the region RA is larger than or equal to the area M1, and that the region RB is larger than or equal to the area M2. For example, the region RA may have the same size as the region RB.

As described above, since the pad P1 is partitioned into the region RA and the region RB, it is easy to bring the probe of the measurement device in contact with the pad P1 in measurement.

The pad P1 of FIG. 5C (the third form) is physically partitioned into a region RA, a region RB, and a region RC. Note that the region RA, the region RB, and the region RC are electrically coupled to one another.

The region RA is the same as the one in FIG. 5B; hence, description thereof is omitted.

The region RB is a region with which the probe of the measurement device is brought in contact, as in FIG. 5B. In this case, however, the region RB of FIG. 5C has the same size as the area M2 of FIG. 5A.

The region RC is a region to which the lead frame of the IC (for example, the IC 30A) is coupled and corresponds to a "third region".

Although in FIG. 5C, the regions RA, RB, and RC have the same size, those regions may have different sizes as a possible configuration. Note that it is desirable that the region RA, to which the wire W1A is to be coupled, and the region RC, to which the lead frame of the IC is to be coupled, have approximately the same size (area).

In this configuration, since the region RB and the region RC have their own sections, it is possible to reliably prevent a coupling failure that would be caused when the lead frame of the IC is coupled to a portion that was damaged by bringing the probe into contact with it in measurement.

Note that the order of the regions RA, RB, and RC is not limited to the one shown in the figure. For example, the region RB and the region RC may be arranged to be on both sides of the region RA. In addition, although the regions RA, RB, and RC are arranged in a straight line in FIG. 5C, the disclosure is not limited to this arrangement. For example, they may be arranged in an L shape or the like.

<<<Method of Manufacturing Semiconductor Module 10>>>

Figure 6:
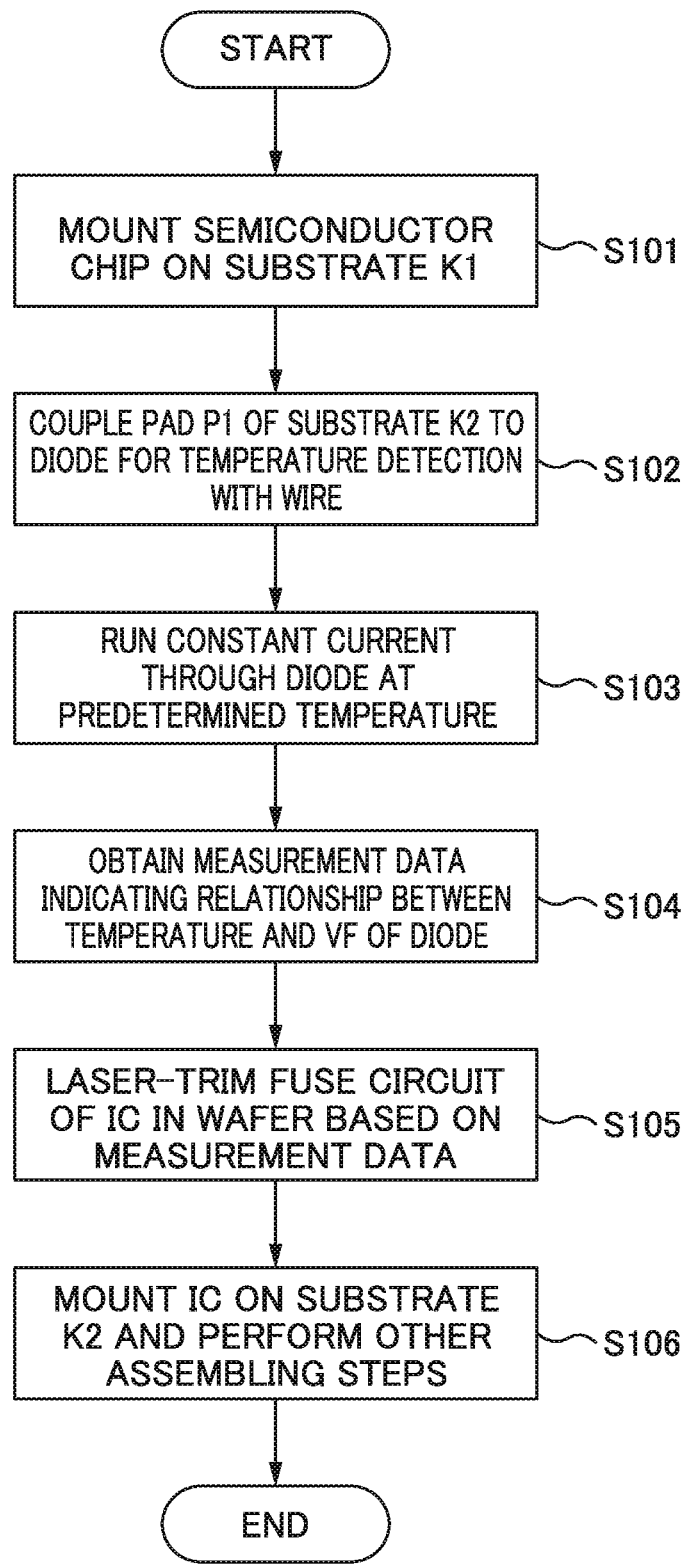
FIG. 6 is a flowchart illustrating an example of a method of manufacturing the semiconductor module 10.
Figure 7:
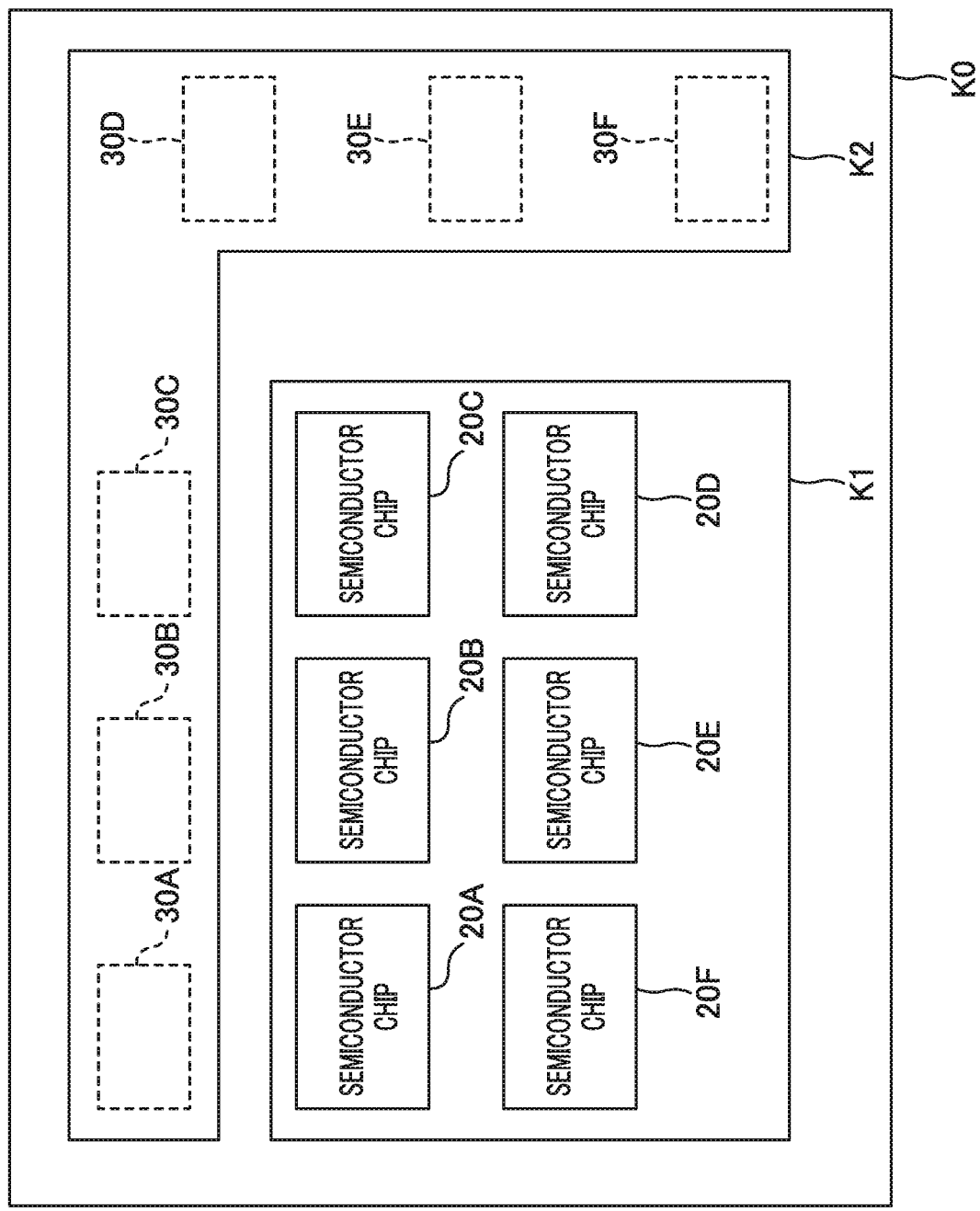
FIG. 7 is a diagram illustrating semiconductor chips 20A to 20F mounted on a substrate K1.
Figure 8:
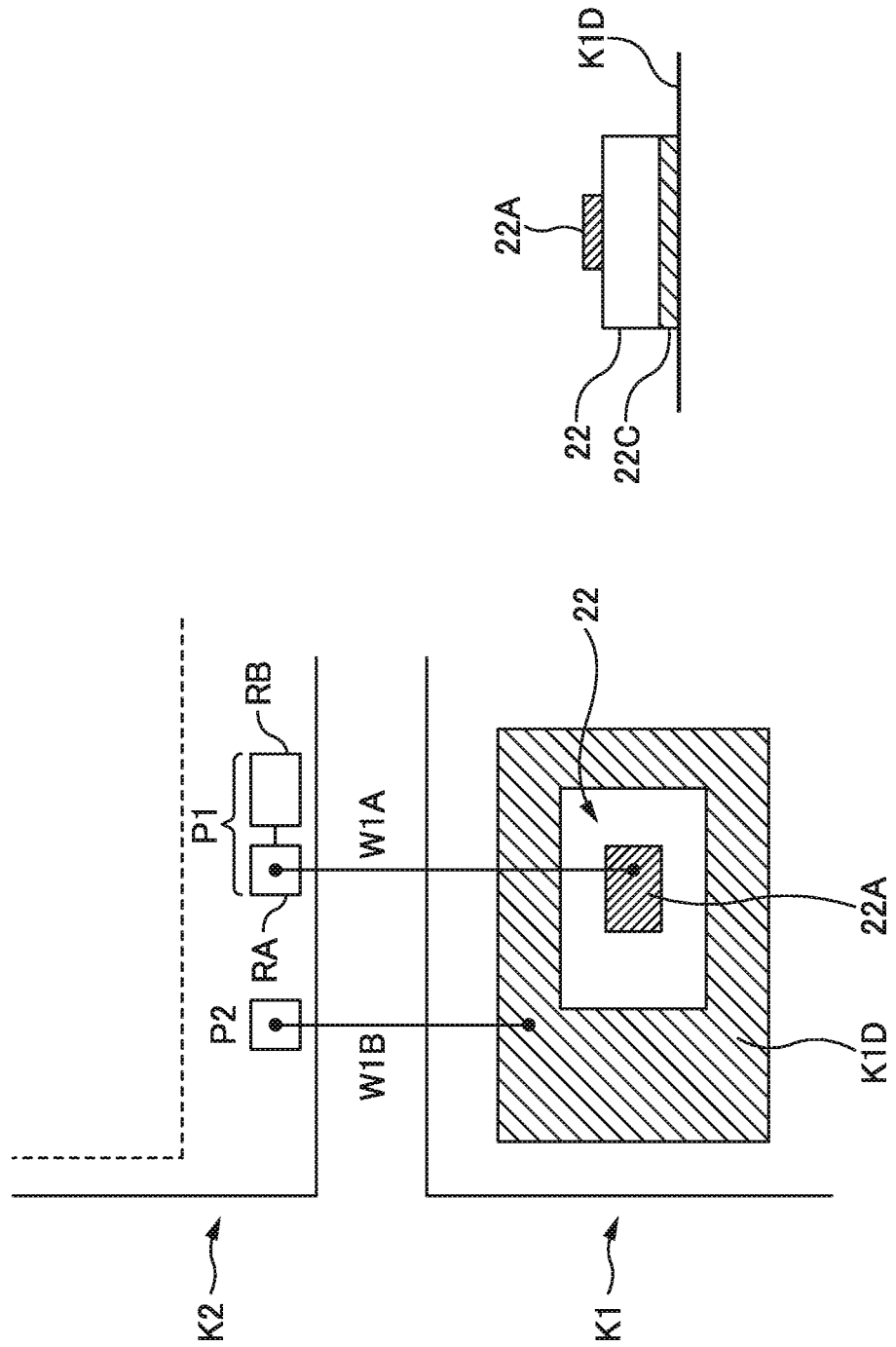
FIG. 8 is a diagram illustrating how pads P1 and P2 on a substrate K2 are coupled to a diode 22.
Figure 9:
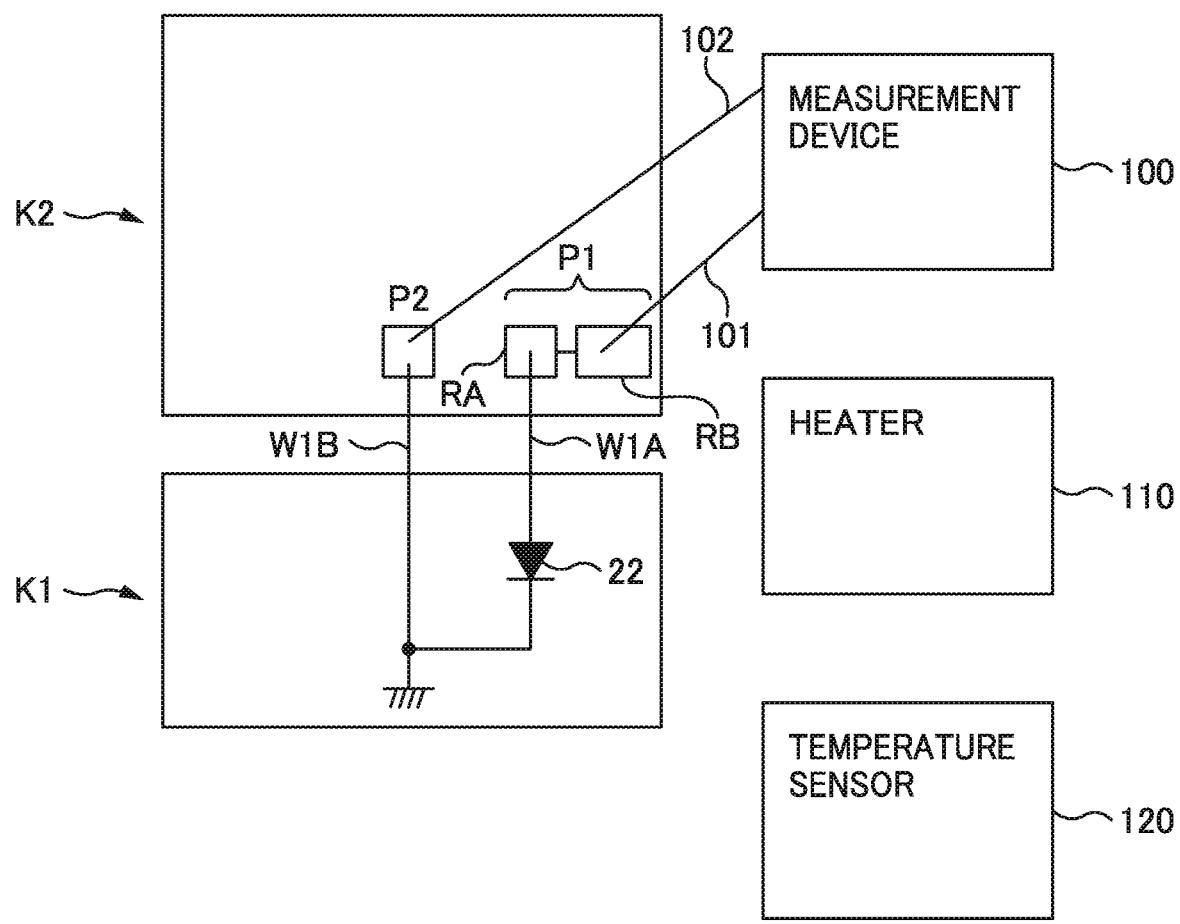
FIG. 9 is a diagram for explaining measurement of temperature characteristics of the diode 22.

FIG. 6 is a flowchart showing an example of a method of manufacturing the semiconductor module 10. FIG. 7 is a diagram illustrating the semiconductor chips 20A to 20F mounted on the substrate K1. FIG. 8 is a diagram illustrating how the pads P1 and P2 on the substrate K2 are coupled to the diode 22. FIG. 9 is a diagram for explaining measurement of the temperature characteristics of the diode 22. Note that here, the pad P1 is the one in FIG. 5B (the second form).

First, as illustrated in FIG. 7, the semiconductor chips 20A to 20F are mounted on the substrate K1 (S101: the first mounting step). In this state, the ICs 30A to 30F have not been mounted on the substrate K2 yet, and coupling using the sets of wiring W1 to W6 has also not been made yet. In FIG. 7, the positions (regions) to which the ICs 30A to 30F are to be mounted on the substrate K2 are indicated by dashed lines. In FIG. 7, illustration of the pads P1 to P3 provided on the substrate K2 is omitted. Although in the following, the process for the semiconductor chip 20A and the IC 30A (the part surrounded by the dashed-dotted lines in FIG. 1) will be described, the same applies to each of the combinations of the semiconductor chips 20B to 20F and the respective ICs 30B to 30F.

Next, as illustrated in FIG. 8, the pad P1 of the substrate K2 (specifically, the region RA) is coupled to the anode 22A of the diode 22 of the semiconductor chip 20A on the substrate K1 with the wire W1A (S102: a bonding step). Note that as illustrated in FIG. 8, the cathode 22C of the diode 22 is coupled to a conductive trace K1D on the upper surface of the substrate K1. The conductive trace K1D is coupled to a not-illustrated ground line. This conductive trace K1D (in other words, the cathode 22C of the diode 22) is coupled to the pad P2 with the wire W1B. Although not illustrated, the gate of the switching device 21 is coupled to the pad P3 with the wire W1C.

Next, as illustrated in FIG. 9, while the temperature of the entire module is controlled to be at a predetermined temperature by using a heater 110, a temperature sensor 120, and other tools, a constant current is run through the diode 22 (S103) and the forward voltage VF of the diode 22 is measured by using the measurement device 100. Specifically, the probe 101 of the measurement device 100 is brought in contact with the region RB of the pad P1, and a probe 102 is brought in contact with an electrode pad at the ground potential (GND pad). Although in FIG. 9 the probe 102 is in contact with the pad P2, the position with which the probe 102 is brought in contact is not necessarily the pad P2. Since the pad P2 is coupled to the wire W1B, the probe 102 may be coupled to another GND pad (not illustrated). Then, a constant current is run through the diode 22, and the forward voltage VF at that time is measured. Through this process, measurement data indicating the relationship between temperature and the forward voltage VF of the diode 22 is obtained (S104: a measurement step). Since the region RB has its own section separate from the region RA and is larger than the area M2 which is a minimum area necessary for the contact with the probe 101 (see FIGS. 5A and 5B), the measurement is easier.

Next, the fuse circuit 34 of the IC 30A (in the state of a wafer) to be disposed being associated with the measured semiconductor chip 20A is laser-trimmed based on the measurement data (S105: trimming step).

Then, the trimmed IC 30A is mounted on the substrate K2 (S106: a second mounting step). Note that when the IC 30A is mounted on the substrate K2, the lead frame of the IC 30A is coupled to the region RB. The same process is applied to the ICs 30B to 30F.

After that, other assembling steps are performed. For example, steps such as covering the upper surface of each semiconductor chip and each IC with a sealing gel or a cover and processing external terminals are performed to complete the semiconductor module 10.

In the embodiment of the present disclosure, as described above, the fuse circuit 34 of the IC 30A is trimmed with the use of the measurement data on the semiconductor chip 20A measured after the semiconductor chip 20A is mounted on the substrate K1 (after coupling of the wire W1A). Thus, the effects of the stress caused in mounting (change in the temperature characteristics due to the strain in the diode 22) and the variation in wiring resistance are taken into consideration in the correction. This can improve the accuracy in the correction, and this in turn can improve the accuracy in the temperature detection.

Modification Example

Figure 10:
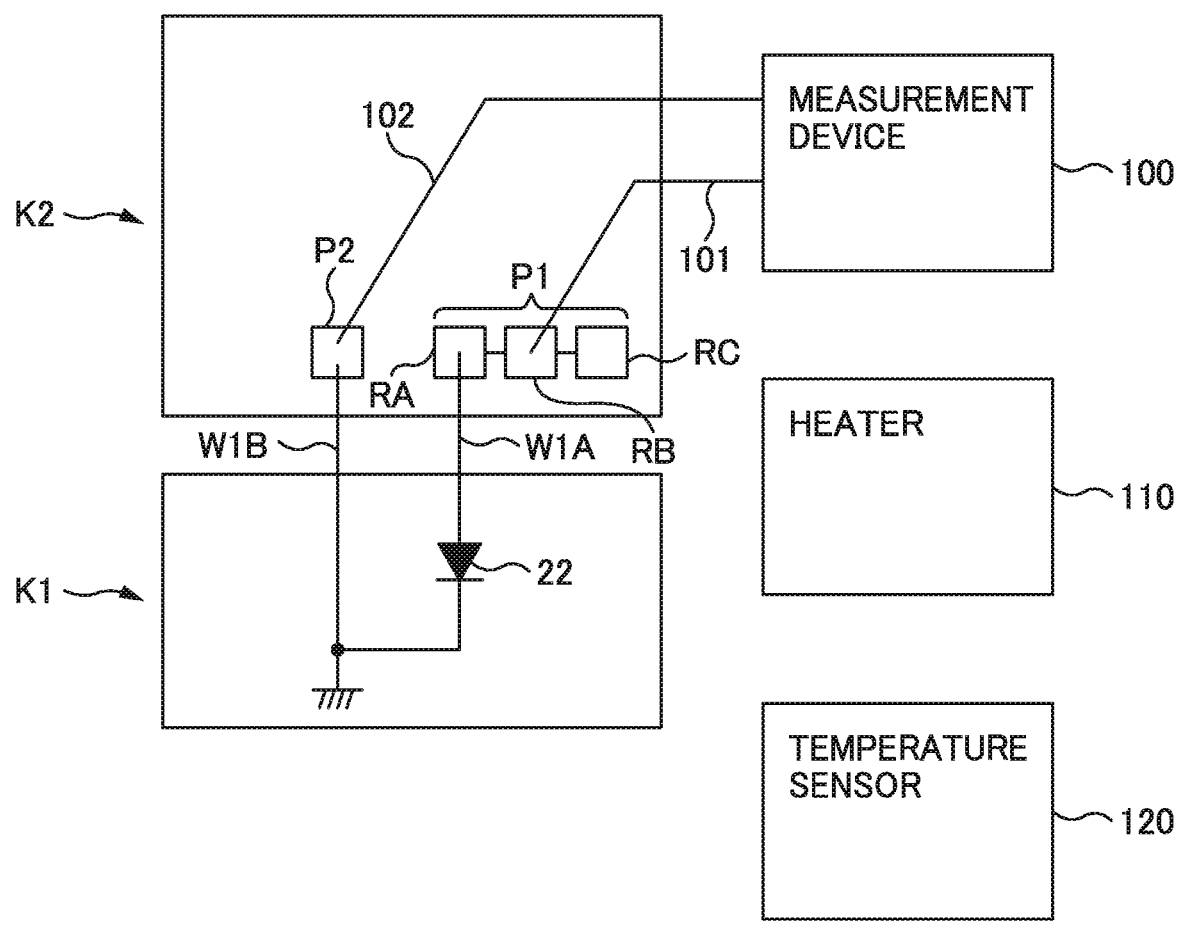
FIG. 10 is a diagram for explaining measurement of temperature characteristics of the diode 22 in a modification example.

FIG. 10 is a diagram for explaining measurement of the temperature characteristics of the diode 22 in a modification example. This modification example employs the pad P1 of the one in FIG. 5C (the third form) having the regions RA, RB, and RC. Note that the region RA is coupled to the wire W1A in step S102.

In step S104 for obtaining measurement data on the diode 22, the probe 101 of the measurement device 100 is brought in contact with the region RB, and measurement is conducted as in FIG. 9. Based on the measurement data, the fuse circuit 34 of the IC (for example, the IC 30A) is laser-trimmed.

Then, in step S106 in which the IC is mounted on the substrate K2, the lead frame of the IC is coupled to the region RC. In the case of this modification example, even if the region RB is damaged in measurement, it is possible to prevent a coupling failure because the lead frame of the IC is coupled to the region RC.

Although in FIGS. 9 and 10, one probe 101 is brought in contact with the region RB of the pad P1, the number of probes may be two (two probes, one for supplying current and the other for measuring voltage). In this case, the pad P1 (the region RB) has a pad size large enough to be in contact with two probe 101 (the area M2 has a size to be in contact with two probes 101).

Recapitulation

The semiconductor module 10 and the method of manufacturing the semiconductor module 10, which are embodiments of the present disclosure, have been described above. The semiconductor module 10 according to an embodiment of the present disclosure includes the semiconductor chips 20A to 20F, the ICs 30A to 30F, and the mounting boards (the substrates K1 and K2 and the base substrate K0). Then, as illustrated in FIG. 5A, the pad P1 coupled to the diode 22 with the wire W1A has a size larger than the sum of the area M1 which is a minimum area necessary to be coupled to the wire W1A and the area M2 which is a minimum area necessary to be in contact with the probe 101 of the measurement device 100. This configuration makes it possible to bring the probe 101 of the measurement device 100 reliably in contact with the pad P1, improving the accuracy in the measurement, and making it possible to correct the temperature characteristics of the diode 22 appropriately. This in turn improves the accuracy in the temperature detection.

The mounting boards of the semiconductor module 10 include the substrate K1 provided with the semiconductor chips 20A to 20F, the substrate K2 provided with the ICs 30A to 30F, and the base substrate K0 provided with the substrate K1 and the substrate K2. The pad P1 is provided on the substrate K2.

With this configuration, even though the substrate (substrate K1) on which semiconductor chips are mounted and the substrate (substrate K2) on which ICs are mounted are different substrates, it is possible to improve the accuracy in the correction and to improve the accuracy in the temperature detection.

The pad P1 illustrated in FIG. 5B is partitioned into the region RA to which the wire W1A is coupled and the region RB with which the probe 101 of the measurement device 100 is brought in contact with. This makes contact with the probe 101 of the measurement device 100 easier in measurement.

The pad P1 illustrated in FIG. 5C is partitioned into the region RA to which the wire W1A is coupled, the region RB with which the probe 101 of the measurement device 100 is brought in contact, and the region RC which is coupled to the IC (IC 30A or the like). Thus, it is possible to reliably prevent a coupling error that would be caused when the lead frame of the IC is coupled to a portion that was damaged by bringing the probe 101 into contact with it in measurement.

It is desirable that the region RA and the region RC have approximately the same size. This will enable reliable coupling with the wire W1A and the lead frame of the IC 30A.

The fuse circuit 34 includes the variable resistor having a combination of the resistors R1 to R7 and the fuses f1 to f7, and the reference voltage Vref is corrected by selectively laser-trimming the fuses f1 to f7 based on measurement data on the forward voltage VF of the diode 22. This enables cost reduction compared to the case of using a nonvolatile memory or the like for the correction.

The method of manufacturing the semiconductor module 10 includes step S101 of mounting the semiconductor chips (20A and others), step S102 of coupling the pad P1 to the diode 22 with the wire W1A, (step S103) supplying a predetermined current to the diode 22 at a predetermined temperature, step S104 of obtaining measurement data indicating the forward voltage VF, step S105 of laser-trimming the fuse circuit 34 based on the measurement data, and step S106 of mounting the laser-trimmed ICs. These processes improve the accuracy in the correction and in turn improves the accuracy in the temperature detection.

In step S101, the semiconductor chips (20A and others) are mounted on the substrate K1; in step S102, the pad P1 of the substrate K2 is coupled to the diode 22 of the substrate K1 with the wire W1A; and in step S106, the laser trimmed ICs are mounted on the substrate K2. With these steps, even though the substrate (substrate K1) on which the semiconductor chips are mounted and the substrate (substrate K2) on which the ICs are mounted are different substrates, it is possible to improve the accuracy in the correction and in turn improve the accuracy in the temperature detection.

The pad P1 of FIG. 5B has the region RA and the region RB. The region RA is coupled to the wire W1A in step S102, and the region RB comes in contact with the probe 101 of the measurement device 100 in step S104 and is coupled to the lead frame of the IC in step S106. This configuration makes the measurement easier and improves the accuracy in the measurement.

The pad P1 of FIG. 5C has the region RA, the region RB, and the region RC. The region RA is coupled to the wire W1A in step S102, the region RB comes in contact with the probe 101 of the measurement device 100 in step S104, and the region RC is coupled to the lead frame of the IC in step S106. With this configuration, even if the region RB is damaged in the measurement, the lead frame of the IC is coupled to the region RC, and thus it is possible to prevent a coupling failure.

The present disclosure has been made in light of conventional problems as described earlier, and an object thereof is to provide a semiconductor module and a method of manufacturing a semiconductor module in which the accuracy in temperature detection is improved.

With the present disclosure, it is possible to provide a semiconductor module in which the accuracy in temperature detection is improved.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A semiconductor module with temperature characteristics adjustable through a measurement device, the semiconductor module comprising:
    a semiconductor chip including a switching device and a diode for temperature detection, a forward voltage of the diode being measurable by a first probe and a second probe of the measurement device;
    an integrated circuit including a correction circuit and a control circuit, the correction circuit being configured to generate a corrected reference voltage, the control circuit being configured to receive the corrected reference voltage and a drive signal, and to control switching of the switching device based on the corrected reference voltage and the drive signal; and
    a mounting board having the semiconductor chip and the integrated circuit mounted thereon, wherein
    the mounting board includes
        a first pad configured to be coupled to an anode of the diode with a first wire, an upper surface of the first pad including
            a first region to which the first wire is to be coupled,
            a second region with which the first probe of the measurement device is to be brought in contact, and
            a third region that is coupled to the integrated circuit, the first, second and third regions being physically separate from one another, but being electrically coupled to one another, and
        a second pad configured to be coupled to a cathode of the diode with a second wire and to be in contact with the second probe of the measurement device for measuring the forward voltage.

2. The semiconductor module according to claim 1, wherein
    the mounting board includes
        a first substrate having the semiconductor chip mounted thereon, a second substrate having the integrated circuit mounted thereon, and
a base substrate having the first substrate and the second substrate formed thereon; and
the first pad is formed on the second substrate.

3. The semiconductor module according to claim 1, wherein
the first region and the third region have approximately the same size.

4. The semiconductor module according to claim 1, wherein
the correction circuit includes a variable resistor formed by a plurality of resistors and a plurality of fuses, the correction circuit generating the corrected reference voltage by selectively laser-trimming the plurality of fuses based on measurement data of the forward voltage of the diode from the measurement device.

* * * * *